United States Patent [19]

Munemasa et al.

[11] Patent Number: 5,896,012
[45] Date of Patent: Apr. 20, 1999

[54] METAL ION PLASMA GENERATOR HAVING MAGNETIC FIELD FORMING DEVICE LOCATED SUCH THAT A TRIGGERING IS BETWEEN THE MAGNETIC FIELD FORMING DEVICE AND AN ANODE

[75] Inventors: Jun Munemasa, Takasago, Japan; Alexander Elkind; James R Treglio, both of San Diego, Calif.

[73] Assignees: Kabushiki Kaisha Kobe Seiko Sho, Kobe, Japan; ISM Technologies, Inc., San Diego, Calif.

[21] Appl. No.: 08/908,985

[22] Filed: Aug. 8, 1997

[51] Int. Cl.$^6$ .............. H05B 31/026; H01J 7/24
[52] U.S. Cl. .................. 315/111.41; 313/231.41
[58] Field of Search ............. 315/111.21, 111.51, 315/111.81, 111.41; 313/231.41, 231.51, 231.61; 118/723 R; 204/298.41

[56] References Cited

U.S. PATENT DOCUMENTS 4,612,477  9/1986  Dothan ................. 315/111.21
5,142,198  8/1992  Smith .................... 315/111.21

Primary Examiner—Michael Shingleton
Attorney, Agent, or Firm—Oblon, Spivak, McClelland, Maier & Neustadt, P.C.

[57] ABSTRACT

When a trigger discharge between a metal cathode and a trigger ring induces a vacuum-arc discharge between the cathode an anode, which vaporizes the substances of the cathode surface to produce a metal ion plasma, setting the pulse length of the arc pulse applied between the cathode and the anode to 1 msec or longer will soon short-circuit between the cathode and the trigger ring due to the vaporized substances deposited on the surface of the insulating ring. In order to solve this problem, a permanent magnet 36 for forming a magnetic field across a space between the anode 26 and the cathode 34 is provided close to the rear side of the trigger ring 35 so as to guide the substances vaporized from the cathode 34 toward the anode 26. Thereby, a longer continuous operation can be done with setting the arc pulse longer. moreover, since the permanent magnet 36 is provided at the foregoing position, the magnet does not receive a thermal load by the vacuum-arc discharge, which maintains a stable operation and makes the total construction compact.

4 Claims, 3 Drawing Sheets

METAL ION PLASMA GENERATOR HAVING MAGNETIC FIELD FORMING DEVICE LOCATED SUCH THAT A TRIGGERING IS BETWEEN THE MAGNETIC FIELD FORMING DEVICE AND AN ANODE

BACKGROUND OF THE INVENTION

1. Field of the Invention

The present invention relates to a metal ion plasma generator that vaporizes a metal cathode by means of a vacuum-arc discharge to produce a metal ion plasma.

2. Description of the Background Art

An apparatus shown in FIG. 3 is known which produces a metal ion plasma by the vacuum-arc discharge, in which the apparatus is composed of a bar-form metal cathode 52 and a plate-form anode 53 in a vacuum chamber 51 (refer to a disclosure in JP-A-63-276858). The cathode 52 has an axis perpendicular to the anode 53 and is supported by a cathode holder 54. The anode 53 has an opening 55 which is coaxial with and faces with a space to the cathode 52.

The front end part projected from the cathode holder 54 is sheathed by an insulator ring 56 made of an insulating material. And, the insulating ring 56 is further sheathed by a trigger ring 57 made of a conductive material, and a trigger electrode 58 is guided inside the vacuum chamber 51 so as to touch the outer surface of the trigger ring 57.

In the foregoing construction, applying a high pulse voltage having a pulse length of some μ sec between the trigger ring 57 and the cathode 52 through the trigger electrode 58 will generate a trigger discharge therebetween. And then, simultaneously applying a pulse voltage having a predetermined pulse length (hereinafter, arc pulse) between the anode 53 and the cathode 52 will generate a vacuum-arc discharge between the anode 53 and the cathode 52 in which the foregoing trigger discharge is served as a starter. A point called arc spot where energy is locally concentrated emerges at the front end part of the cathode 52 through this vacuum-arc discharge. This part vaporizes and ionizes to produce a metal ion plasma. This metal ion plasma is supplied through the opening 55 of the anode 53 to a processing room (not illustrated) connecting with the foregoing vacuum chamber 51.

When the foregoing apparatus is used for forming a thin film, the foregoing metal ion plasma is supplied on a substrate disposed in the processing room. And, when the foregoing apparatus is used for a metal ion source, the foregoing metal ion plasma is supplied to an ion pullout electrode provided inside the processing room.

While a vacuum-arc discharge is generated between the cathode 52 and the anode 53, vaporized substances from the cathode gradually deposit on the surface of the insulating ring 56. As this coating phenomenon progresses, the resistance between the trigger ring 57 and the cathode 52 decreases gradually because the substances vaporized from the cathode are conductive, which finally short-circuits the trigger ring 57 and the cathode 52 to stop the arc discharge.

This coating phenomenon on the insulating ring 56 is extremely sensitive to a length of the arc pulse applied between the anode 53 and the cathode 52. In most of the cathode materials, setting the pulse length of the arc pulse to 1 msec or longer will stop the arc discharge within 2–3 minutes due to the short circuit between the trigger ring 57 and the cathode 52. Therefore, in the operation of a conventional apparatus, the pulse length of the arc pulse is set to 1 msec or shorter.

However, in the operation with the arc pulse length of 1 msec or shorter as described above, the arc spot is limited to move on the surface of the cathode 52 during the vacuum-arc discharge, thereby the cathode consumes unevenly. Such an uneven consumption of the cathode 52 causes a shorter life of the cathode and an uneven density distribution of plasma reaching at the ion pullout electrode or the like.

In order to prevent this from occurring, it is necessary to set the arc pulse length to 1 msec or longer; however in this case, it stops the arc discharge within few minutes as described above, which disables continuous operation and lowers productivity.

SUMMARY OF THE INVENTION

The present invention has been made in view of the foregoing problems of the conventional apparatus, and it is an object of the present invention to provide a metal ion plasma generator that enables a longer continuous operation with a longer arc pulse length and has a stable performance in a still more compact overall construction.

In order to accomplish the aforementioned object, in a metal ion plasma generator in which: a vacuum chamber contains a bar-form metal cathode, an insulating ring sheathing the front end side of the cathode, a trigger ring sheathing the insulating ring, and an anode having an opening facing to the front edge surface of the cathode; a vacuum-arc discharge between the cathode and the anode is induced by a trigger discharge between the trigger ring and the cathode; by the vacuum-arc discharge, plasmatic vaporized substances are produced from the surface of the cathode; and the vaporized substances are supplied through the foregoing opening; the metal ion plasma generator according to the present invention is characterized in that a magnetic field forming means is provided at a position adjacent to the rear side of the trigger ring and the means forms a magnetic field across a space between the cathode and the anode so as to guide the substances vaporized from the cathode to the anode.

According to the foregoing construction, the vaporized substances from the cathode are guided to the anode by the magnetic field and the amount of the substances attracted toward the surface of the insulating ring decreases, thereby lowering the deposition on the surface of the insulating ring. Consequently, even if the length of the arc pulse applied between the cathode and the anode is set longer, the short circuit between the cathode and the trigger ring through the surface of the insulating ring becomes difficult to occur, whereby a longer operation can be continued.

Besides, the foregoing magnetic field forming means is provided at a position adjacent to the rear side of the trigger ring and close to the space between the cathode and the anode. Therefore, a small-sized magnet with a comparatively low magnetic force can produce an effective magnetic field in the foregoing space. And, there is not any thermal load by the arc discharge between the cathode and the anode. In consequence, the total construction can be made more compact and a stable operation can be maintained.

Further, the forgoing trigger ring is preferably made of a magnetic substance. In such a construction, if the magnetic field forming means is provided on the rear side of the trigger ring, the magnetic field strength across the space between the cathode and the anode increases because the trigger ring is magnetized. Consequently, a metal film coating on the surface of the insulating ring is restrained more reliably, which enables a still longer continuous operation with a longer arc pulse length.

And, the foregoing magnetic field forming means is preferably formed of a permanent magnet. When the means is formed of a coil, it becomes necessary to supply the power for the coil in addition to the power supply for the anode, cathode, and the like; however, the permanent magnet does not require such power supply, which further simplifies the total construction.

BRIEF DESCRIPTION OF THE DRAWINGS

The present invention will be fully understood from the detailed description given below and from the accompanying drawings of the preferred embodiment of the invention, which, however, should not be taken to limit the specific embodiment, but are for explanation and understanding, in which.

DESCRIPTION OF THE PREFERRED EMBODIMENT

Figure 2:
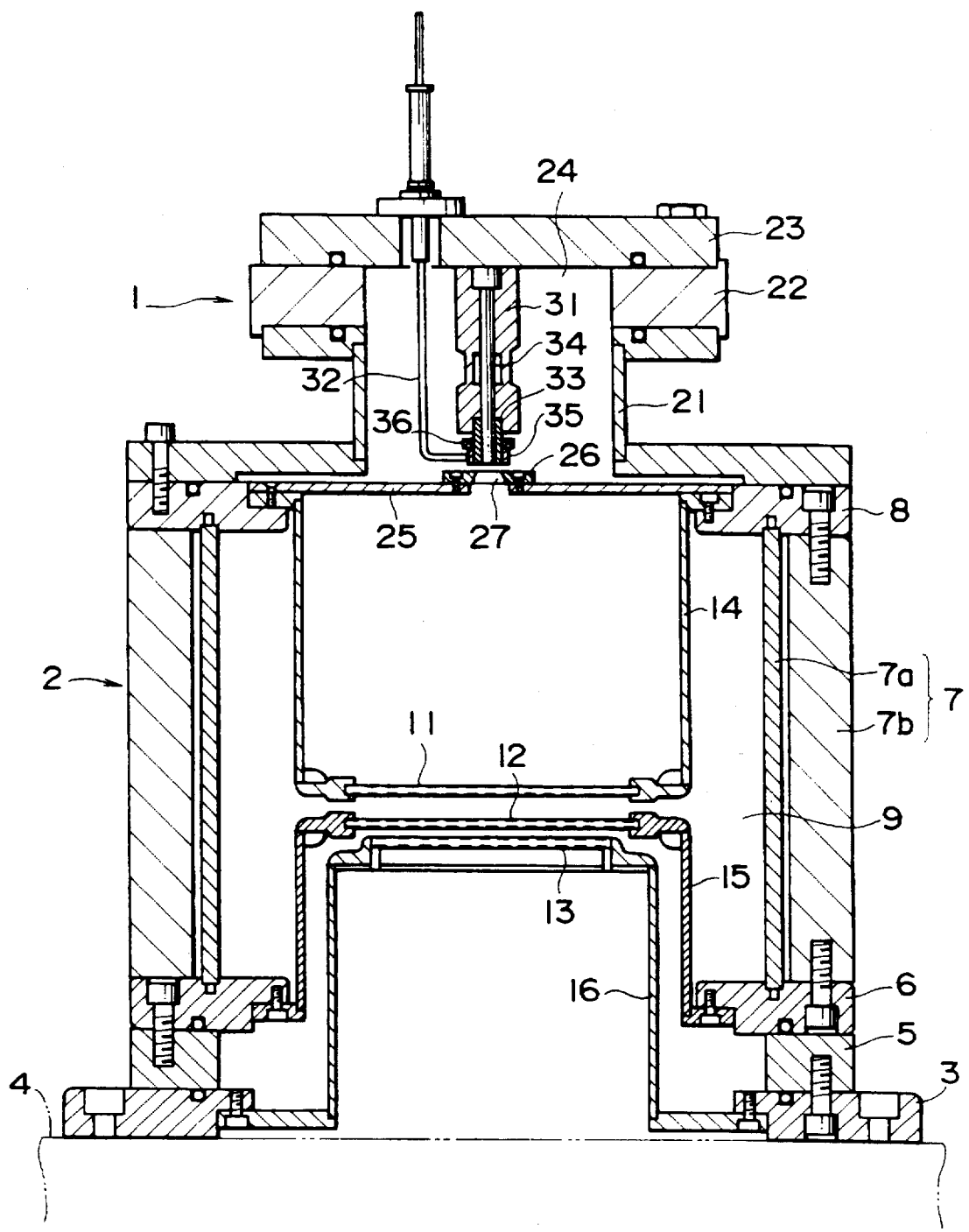
FIG. 2 is sectional view showing a construction of a metal ion source wherein the foregoing generator is provided at one side.
Figure 3:
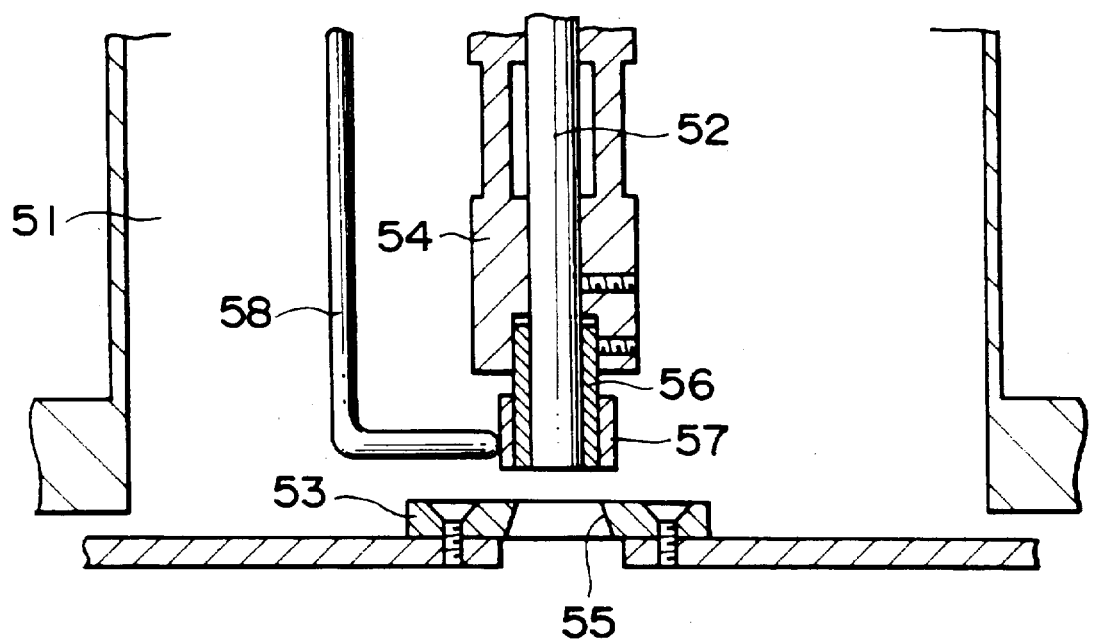
FIG. 3 is a sectional view showing a major construction in a conventional metal ion plasma generator.

With reference to the accompanying drawings, one preferred embodiment of the present invention will hereafter be described FIG. 2 shows a metal ion source that the metal ion plasma generator 1 of this embodiment is coupled to one end of an ion beam pullout apparatus 2.

When this metal ion source is used, a base flange 3 of the ion beam pullout apparatus 2 is hermetically connected to a processing apparatus 4 such as an ion implantation apparatus or a thin film forming apparatus.

On the foregoing base flange 3, an insulating bottom ring 5 and an intermediate flange 6 are fixed sequentially hermetically, and further on the intermediate flange 6, a cylindrical housing 7 and an upper flange 8 are fixed sequentially. The cylindrical housing 7 consists of an inner cylinder 7a and an outer cylinder 7b each concentrically formed, and inside of the inner cylinder 7a a vacuum chamber is formed.

Three grids of an accelerating grid 11, a suppresser grid 12, and a ground grid 13 each are disposed with a specific distance in parallel, on a virtually axial center in the vacuum chamber 9. The accelerating grid 11 is fixed to the lower end of a first cylindrical body 14 extending downward from the inside of the upper flange 8, and the suppresser grid 12 is fixed to the upper end of a second cylindrical body 15 extending upward from the inside of the intermediate flange 6. And, the ground grid 13 is fixed to the upper end of a third cylindrical body 16 extending upward inside of the second cylindrical body 15 from the inside of the base flange 3.

The accelerating grid 11 is generally applied a high voltage, for example, some kV to some hundred kV, and the suppresser grid 13 is applied a negative voltage. And, the ground grid 14 is earthed. When a metal ion plasma is guided into the vacuum chamber 9 of the ion beam pullout apparatus 2 from the metal ion plasma generator 1 described later, metal ions in the plasma are accelerated by the electric fields between the grid 11 and 12, and between the grid 12 and 13, and are supplied to the foregoing processing apparatus 4 through these grids. The foregoing suppresser grid 12 is to prevent the reverse current of the secondary electrons.

The aforementioned metal ion plasma generator 1 is provided with a cylindrical housing 21 and an insulating upper ring 22 which are sequentially hermetically fixed to the upper side of the upper flange 8. On the upper ring 22, a lid 23 is hermetically fixed to cover the top opening, whereby a vacuum chamber 24 is formed to communicate with the vacuum chamber 9 of the foregoing ion beam pullout apparatus 2.

Between the vacuum chamber 9 and 24 an anode supporting plate 25 is fixed to the inner surface of the upper flange 8 on the periphery. On the center of the anode supporting plate 25 a circular anode 26 is attached, and on the center of the anode 26 an opening 27 is formed which is slightly larger in diameter than that of a cathode 34 described later. Both the vacuum chambers 9, 24 communicate with each other through the opening 27.

A cathode holder 31 is attached on the center of the foregoing lid 23, drooping toward the foregoing anode 26. And, a bar-form trigger electrode 32 with the end part bent in a L-shaped letter hangs down in parallel to the cathode holder 31, and it is attached to the lid 23 to bore therethrough from above.

Figure 1:
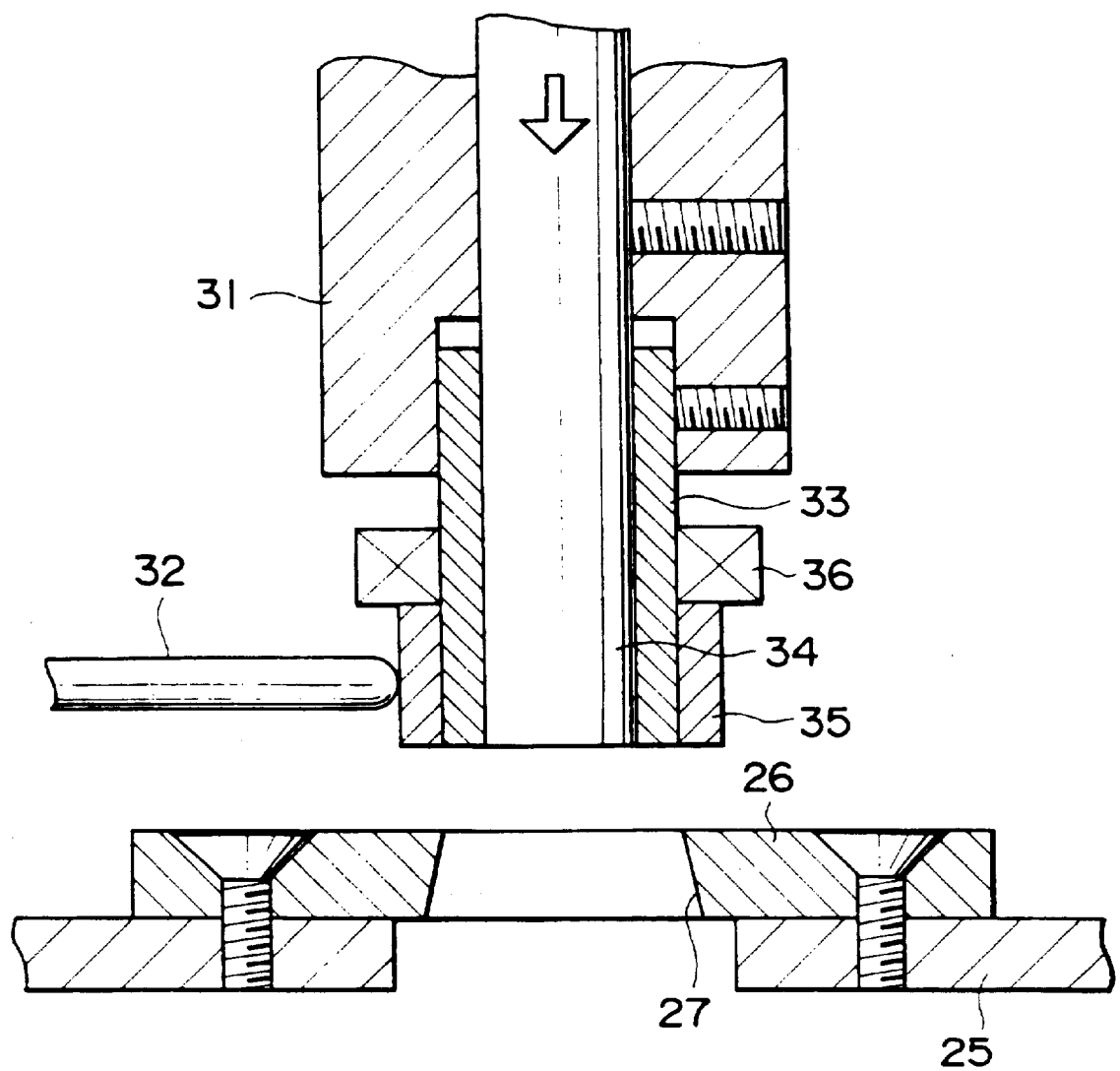
FIG. 1 is a sectional view showing a major construction of a metal ion plasma generator in one embodiment according to the present invention.

As shown in FIG. 1, a cylindrical insulating ring 33 made of a ceramic material and the like is attached on the lower end side of the foregoing cathode holder 31, projecting downward from the lower end of the cathode holder 31. And, a bar-form metal cathode 34 is supported by the cathode holder 31 and the insulating ring 33 such that the cathode 34 bores therethrough sequentially. The cathode 34 is supported such that the edge surface thereof is virtually flush with that of the insulating ring 33. Thus, the cathode 34 is maintained to be at a position such that the cathode 34 faces with a specific gap to the opening 27 of the foregoing anode 26 on the coaxial line.

The lower outer surface of the foregoing insulating ring 33 is sheathed with a trigger ring 35 made of a conductive magnetic material such as Fe, Cr, or Ni such that the end surface of the trigger ring 35 is almost flush with that of the insulating ring 33. The front end of the foregoing trigger electrode 32 touches the outer surface of the trigger ring 35. A trigger pulse voltage described later is applied to the trigger ring 35 through the trigger electrode 32.

Further, the insulating ring 33 fits into a ring permanent magnet 36 as the magnetic field forming means, and the magnet 36 is in contact with the edge surface of the trigger ring 35 on the side of the cathode holder 31. The permanent magnet 36 is magnetized in the axial direction such that the upper side thereof is a N/S pole and the lower side is a S/N pole, and has a function described later.

In the apparatus of the foregoing construction, when the vacuum chambers 9, 24 are evacuated through the foregoing processing apparatus 4 and reach a specific degree of vacuum, a trigger pulse (pulse length: some μ sec) of a high voltage about −30 kV is applied through the trigger electrode 32 between the trigger ring 35 and the cathode 34. This trigger pulse generates a trigger discharge between the trigger ring 35 and the cathode 34 overpassing the insulating ring 33. This trigger discharge is served as a starter for a cathode arc discharge between the cathode 34 and the anode 26. That is, when a voltage having a specific pulse length (hereinafter, arc pulse) is applied between the anode 26 and the cathode 34 at the same time with the application of the trigger pulse, a cathode arc discharge is induced between the anode 26 and the cathode 34 for the foregoing arc pulse length while the foregoing trigger discharge functions as a starter. During the arc discharge, a spot called arc spot of a diameter less than 1 mm where energy concentrates locally emerges on the edge surface of the cathode 34, and substances in this part vaporize and ionize to produce a metal ion plasma. The arc spot moves about at random on the surface of the cathode 34 for a set arc pulse length.

Thus, a metal ion plasma with a high ionization rate is produced, which is supplied through the opening 27 of the anode 26 to the vacuum chamber 9 of the ion beam pullout apparatus 2. As Metal ions in the plasma inside the vacuum chamber 9 reach the accelerating grid 11, the metal ions are accelerated between the accelerating grid 11 and the suppressor grid 12 and the accelerated metal ions are guided into the processing apparatus 4. The metal ions thus guided in the processing apparatus 4 are used for ion implantation, ion beam assisted deposition, spatter cleaning, or the like.

If, in a conventional apparatus, the foregoing arc pulse length is set to more than 1 msec, the edge surface of the insulating ring 33 is coated with vaporized substances from the cathode 34. Consequently, the trigger ring 35 and the cathode 34 are soon short-circuited to stop the arc discharge.

In order to prevent this phenomenon, this embodiment is provided with a permanent magnet 36 for forming a magnetic field across a space between the cathode 34 and the anode 26 at a position adjoining to the trigger ring 35. Thereby, the magnetic field induces the vaporized substances from the cathode 34 to move straight toward the anode 26 and not to expand to the side of the insulating ring. Consequently, with the arc pulse length of more than 1 msec, longer operations become possible in various operating conditions.

To show one example of the above; in an operating condition that titanium (Ti) is used for the cathode, arc pulse is set to 5 msec, arc pulse frequency to 5 Hz, and arc current to 100 A; the operation by the construction not having the foregoing permanent magnet 36 (hereinafter, conventional construction) stopped the arc discharge within few minutes through short-circuiting across the surface of the insulating ring 33.

In contrast to this, this embodiment having the permanent magnet 36 enabled a continuous operation of some hours. When, in addition to this, a cathode feed mechanism was used to move the cathode ahead as much as it consumes so that the end surface of the cathode is always flush with the edge surface of the insulating ring, a continuous operation of 24 hours was achieved.

Furthermore, in the same amount of arc current as the conventional construction, ion induction by a magnetic flux generated by the permanent magnet 36 increased the amount of ions passing through the opening 27 of the anode 26 and made the consumed surface of the cathode 34 more flat and even. Consequently, the density distribution of plasma on the surface of the accelerating grid 11 in the ion beam pullout apparatus 2 was made more uniform. Thereby, the amount of ion beam current pulled out from the ion beam pullout apparatus 2 became about double compared to the conventional construction.

As described above, the function of the magnetic field by the permanent magnet 36 restrains the vaporized substances from depositing on the edge surface of the insulating ring 33 in this embodiment. Therefore, the short circuit between the cathode 34 and the trigger ring 35 across the surface of the insulating ring 33 is reduced, even if the length of the arc pulse applied between the cathode 34 and the anode 26 is set to more than 1 msec. Thus, a longer continuous operation becomes possible.

Furthermore, as to a position for attaching the permanent magnet 36, the position adjoining to the rear (upper) edge of the trigger ring 35 is the most suitable as in this embodiment. In order to form a magnetic field across a space between the cathode 34 and the anode 26, the following two positions can be considered, for example: (1) space between the cathode 34 and the anode 26, (2) outer surface of the trigger ring 35. However, in the construction by (1), a thermal load by the arc discharge on the cathode surface degrades the characteristics of the magnet. And, adhesion of the vaporized metal from the cathode 34 requires a periodic maintenance. In the construction by (2), the magnet interferes with the trigger electrode 32 for supplying a high trigger voltage to the trigger ring 35; and therefore, it needs an additional attachment to insulate from the trigger electrode 32, thus complicating the construction. And, the trigger discharge damages the magnet. Moreover, in a construction to attach the magnet to the rear side apart from the trigger ring 35, for example, on the outer surface of the cathode holder 31, the magnetic field strength around the surface of the cathode 34 becomes low due to a longer distance, which requires a magnet having a very high magnetic force for giving an appropriate magnetic field strength across the space between the cathode 34 and the anode 26.

In contrast to these, in the construction as in this embodiment wherein the permanent magnet 36 is provided at the position adjoining to the rear side of the trigger ring 35, the foregoing arc discharge or trigger discharge does not influence the magnet and vaporized metal from the cathode 34 does not adhere on it, therefore maintaining a stable operation. And, since the magnet 36 does not interfere with the trigger electrode 32, attachment construction is also simplified. And, since the attachment position is more close to the space between the cathode 34 and the anode 26, the magnetic force to form a specific field strength on the surface of the cathode 34 need not be so high. Consequently, a more inexpensive and small-sized permanent magnet can be applied.

Furthermore, the foregoing embodiment should not be taken to limit the present invention, and various modifications and changes can be made within the scope of the present invention. In the foregoing embodiment, a single cathode type apparatus wherein one cathode 34 is attached inside the vacuum chamber 24 was described as an example; however, the present invention can also be applied to a multi-cathode type apparatus wherein plural cathodes are designed to be attached.

And, in the foregoing embodiment, although the permanent magnet 36 was used for a magnetic field forming means, the permanent magnet can be replaced with a coil. In that case, forming an appropriate magnetic field by the coil requires to place the coil at a position where a high voltage is applied, for example, a high current higher than 50 A has to be supplied to the coil with a 20–80 kV applied. Therefore, the capacity of the insulating transformer has to be made larger, the apparatus becomes bigger and more expensive. On the other hand, the permanent magnet 36 as in this embodiment does not require the power supply, which further simplifies the total construction.

As described hereinabove, the metal ion plasma generator according to the present invention is provided with a magnetic field forming means for forming a magnetic field to guide the vaporized substances from the cathode toward the anode, and the means is placed adjacently to the rear side of the trigger ring which is sheathed on the insulating ring on the front end side of the cathode. Owing to this construction, even if the length of the arc pulse applied between the cathode and the anode is set longer, the short circuit between the cathode and the trigger ring through the surface of the insulating ring becomes difficult to occur, whereby a longer operation can be continued.

Besides, since the foregoing magnetic field forming means is provided at a position adjacent to the rear side of the trigger ring, a small-sized magnet with a comparatively low magnetic force can effectively produce a local magnetic field around the space between the cathode and the anode. And, there is not any thermal load by the arc discharge between the cathode and the anode. In consequence, the total construction can be made more compact and a stable operation can be maintained.

And, when the forgoing trigger ring is made of a magnetic substance, if the magnetic field forming means is provided on the rear side of the trigger ring, the magnetic field strength across the space between the cathode and the anode becomes higher. Consequently, a metal film coating on the surface of the insulating ring is restrained more reliably, and a still longer continuous operation with a longer arc pulse length can be performed.

Furthermore, when the foregoing magnetic field forming means is formed of a permanent magnet, it becomes unnecessary to supply the power required, for example, when the means is formed of a coil. Thereby, the total construction can further be simplified.

While specific embodiments of the present invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. A metal ion plasma generator comprising:

a vacuum chamber;

a bar-form metal cathode in said vacuum chamber;

an insulating ring sheathing an end of the cathode;

an anode having an opening an facing the end of the cathode;

a vacuum arc discharge trigger mechanism comprising a trigger ring mounted to said insulating ring; and a magnetic field forming device located in said vacuum chamber at a position such that said trigger ring is between said magnetic field forming device and said anode.

2. The metal ion plasma generator of claim 1, wherein said magnetic field forming device is a permanent magnet.

3. The metal ion plasma generator of claim 1, wherein said magnetic field forming device is mounted to said insulating ring.

4. The metal ion plasma generator of claim 2, wherein said magnetic field forming device is mounted to said insulating ring.

* * * * *